United States Patent
Ahn et al.

(10) Patent No.: US 11,257,972 B2
(45) Date of Patent: Feb. 22, 2022

(54) SOLAR CELL

(71) Applicant: PETALUX INC., Seongnam-si (KR)

(72) Inventors: Do Yeol Ahn, Seoul (KR); Seung Hyun Yang, Yongin-si (KR)

(73) Assignee: PETALUX INC., Seongnam-si (KR)

( * ) Notice: Subject to any disclaimer, the term of this patent is extended or adjusted under 35 U.S.C. 154(b) by 0 days.

(21) Appl. No.: 16/491,425

(22) PCT Filed: Feb. 6, 2018

(86) PCT No.: PCT/KR2018/001571
§ 371 (c)(1),
(2) Date: Sep. 5, 2019

(87) PCT Pub. No.: WO2018/169207
PCT Pub. Date: Sep. 20, 2018

(65) Prior Publication Data
US 2020/0028016 A1 Jan. 23, 2020

(30) Foreign Application Priority Data
Mar. 13, 2017 (KR) .................. 10-2017-0031239

(51) Int. Cl.
*H01L 31/0687* (2012.01)
*H01L 31/076* (2012.01)
*H01L 31/032* (2006.01)

(52) U.S. Cl.
CPC ........ *H01L 31/0687* (2013.01); *H01L 31/076* (2013.01); *H01L 31/032* (2013.01)

(58) Field of Classification Search
CPC ............. H01L 31/0687; H01L 31/076; H01L 31/032; H01L 31/0326; Y02E 10/548; Y02E 10/544
See application file for complete search history.

(56) References Cited

U.S. PATENT DOCUMENTS

2011/0114995 A1* 5/2011 Ahn .................. H01L 33/26
257/103

FOREIGN PATENT DOCUMENTS

KR 10-2008-0086115 9/2008
KR 10-2012-0057646 6/2012
(Continued)

OTHER PUBLICATIONS

KR20140102850A, Machine Translation, Ahn (Year: 2014).*
(Continued)

*Primary Examiner* — Devina Pillay
(74) *Attorney, Agent, or Firm* — Kile Park Reed & Houtteman PLLC

(57) ABSTRACT

A solar cell that capable of improving light utilization efficiency is disclosed. The solar cell comprises I-VII compound photovoltaic layer, silicon photovoltaic layer, first electrode and second electrode. The I-VII compound photovoltaic layer comprises first and second type I-VII compound layers. The first and second type I-VII compound layer have first and second type impurities, respectively. The second type I-VII compound layer is disposed under the first type I-VII compound layer. The silicon photovoltaic layer comprises first and second type silicon layers. The first and second type silicon layers have first and second type dopants, respectively. The first type and second type silicon layers are disposed under the second type I-VII compound layer and the first type silicon layer, respectively. The first and second electrodes are formed under the second type silicon layer and on a portion of the first type I-VII compound layer, respectively.

4 Claims, 2 Drawing Sheets

(56) References Cited

FOREIGN PATENT DOCUMENTS

| | | | |
|---|---|---|---|
| KR | 10-2013-0052476 | | 5/2013 |
| KR | 10-2014-0102850 | | 8/2014 |
| KR | 20140102850 A | * | 8/2014 |
| KR | 10-1660795 | | 9/2016 |
| KR | 10-1667631 | | 10/2016 |

OTHER PUBLICATIONS

International Search Report for International Application No. PCT/KR2018/001571, dated Jun. 11, 2018.
English Translation of Written Opinion of the International Searching Authority dated Jun. 11, 2018 associated with International Application No. PCT/KR2018/001571.

* cited by examiner

[FIG. 1]
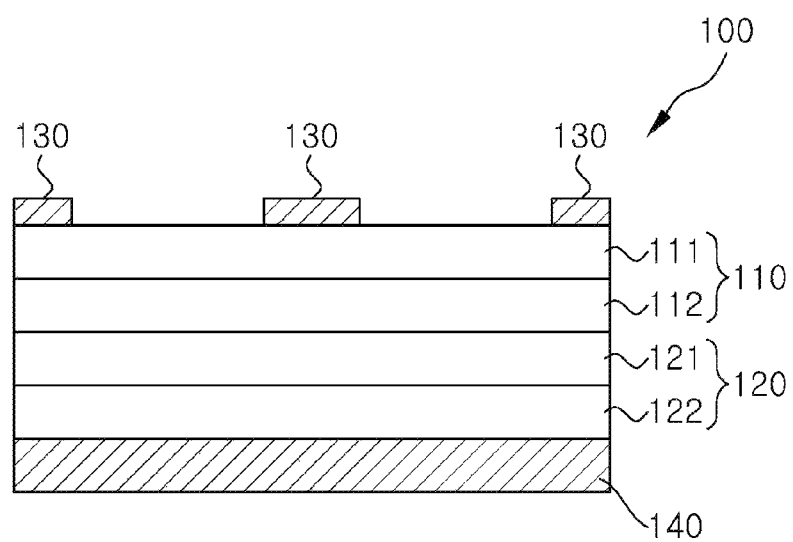
[FIG. 2]
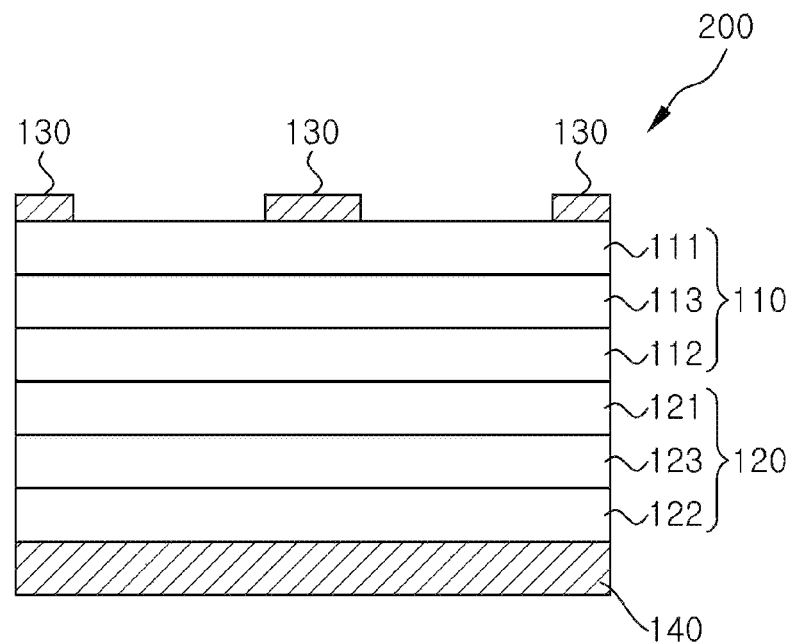

[FIG. 3]
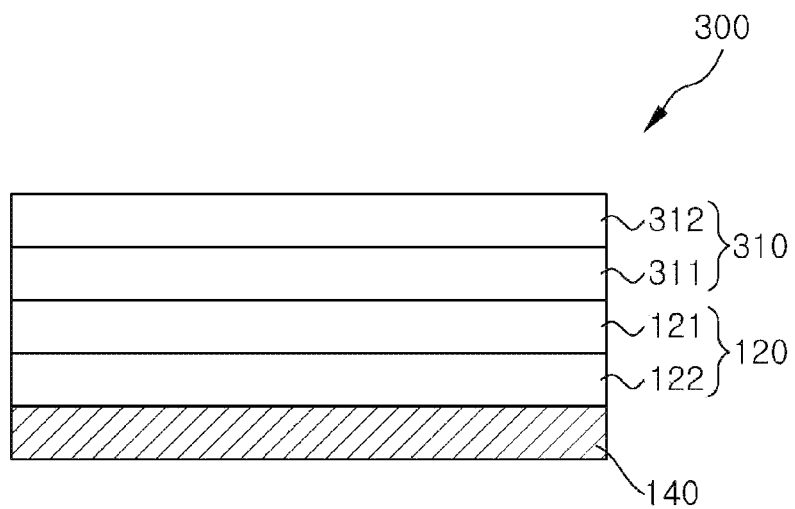
[FIG. 4]
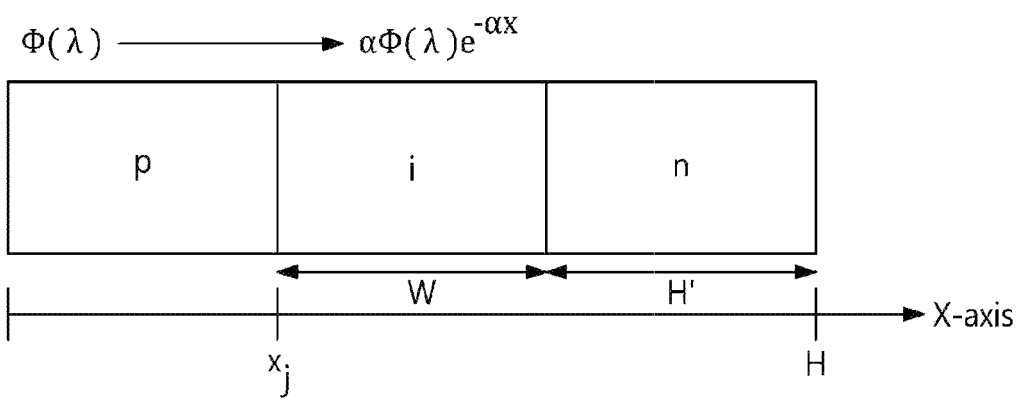

SOLAR CELL

TECHNICAL FIELD

The present invention relates to a solar cell, and more particularly, to a tandem structured solar cell in which photovoltaic layers absorbing different wavelengths are vertically stacked.

BACKGROUND ART

Numerous environmental issues are emerging as the use of fossil fuels increases carbon dioxide dramatically. Accordingly, development of alternative energy such as solar power generation, along with wind power and tidal power generation, is drawing attention.

In particular, photovoltaic power generation is installed in various places because it can be installed at low cost even in a narrow place. A solar cell is used for the photovoltaic power generation. In general, a solar cell is a device that converts solar energy into electrical energy, and has a junction of a p-type semiconductor and an n-type semiconductor. The solar cell is same as a diode in a basic structure.

Most solar cells consist of pn junction diodes of large area. The basic requirements for solar cells for photovoltaic energy conversion are that the p-type semiconductor region has a small electron density and a large hole density and the n-type semiconductor region has a large electron density and a small hole density so that the electrons must be asymmetrically present in the semiconductor structure.

Therefore, in the thermal equilibrium state, a diode composed of a junction between a p-type semiconductor and an n-type semiconductor causes an imbalance of charge due to diffusion caused by a concentration gradient of carriers, and thus an electric field is formed, so that carrier diffusion does not occur. When light above the band gap energy, which is the energy difference between the conduction band and the valence band of the material, is applied to such a diode, electrons that receive light energy are excited to jump from the valence band to the conduction bands. At this time, the electrons excited in the conduction band can move freely, and holes are generated in the valence band where electrons escape. This is called an excess carrier, and the excess carrier diffuses due to the difference in concentration in the conduction band or the valence band. At this time, electrons excited in the p-type semiconductor and holes made in the n-type semiconductor are called minority carriers, respectively, and carriers in the p-type semiconductor or the n-type semiconductor before bonding (that is, holes of the p-type semiconductor and electrons of the n-type semiconductors) are called majority carriers separately from the minority carriers.

The majority carriers are disturbed in flow due to the energy barrier created by the electric field, but electrons, which are the minority carriers of the p-type semiconductor, may move toward the n-type semiconductor. The diffusion of the minority carriers causes a potential difference in the pn junction diode, and when the electromotive force generated between the terminals of the pn junction diode is connected to an external circuit, it acts as a solar cell.

Since such solar cells are not yet good in light efficiency, many studies have been conducted to improve the light efficiency.

For example, Korean Patent No. 10-1667631, 'Thin Film Solar Cell and Manufacturing Method Thereof'" discloses a thin film solar cell in which two photovoltaic layers using a silicon semiconductor are vertically formed.

However, since both photovoltaic layers use silicon, the bands of absorption wavelengths are not significantly different, which limits the utilization efficiency of light.

DETAILED DESCRIPTION OF THE INVENTION

Objects of the Invention

Accordingly, the problem to be solved by the present invention is to provide a solar cell capable of improving the light efficiency.

Technical Solution

A solar cell according to an exemplary embodiment of the present invention for solving this problem comprises a I-VII compound photovoltaic layer, a silicon photovoltaic layer, a first electrode and a second electrode. The I-VII compound photovoltaic layer comprises a first type I-VII compound layer and a second type I-VII compound layer. The first type I-VII compound layer has first type impurities. The second type I-VII compound layer has second type impurities of which polarity is opposite to a polarity of the first type impurities. The second type I-VII compound layer is disposed under the first type I-VII compound layer. The silicon photovoltaic layer comprises a first type silicon layer and a second type silicon layer. The first type silicon layer has first type dopants. The second type silicon layer has second type dopants of which polarity is opposite to a polarity of the first type dopants. The first type silicon layer is disposed under the second type I-VII compound layer. The second type silicon layer is disposed under the first type silicon layer. The first electrode is formed under the second type silicon layer. The second electrode is formed on a portion of the first type I-VII compound layer to expose remaining portion of the first type I-VII compound layer.

For example, the I-VII compounds may include CuCl, CuBr, CuI, AgBr, AgI, CuF, AgF, AgCl, AuF, AuCl, AuBr, AuI, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuF—ClBr, CuFClI, CuFBrI, CuIBrCl, AgFClBr, AgFClI, AgFBrI, AgClBrI, AuFClBr, AuFClI or AuClBrI.

In this case, the first type and the second type are p-type and n-type, or n-type or p-type, respectively.

Meanwhile, the solar cell of may further comprise an undoped I-VII compound layer between the first type I-VII compound layer and the second type I-VII compound layer.

Further, the solar cell of claim may further comprise an undoped silicon layer between the first type silicon layer and the second type silicon layer.

A solar cell according to another exemplary embodiment of the present invention comprises a I-VII compound photovoltaic layer, a silicon photovoltaic layer and an electrode. The I-VII compound photovoltaic layer comprises a transparent electrode layer and a I-VII compound layer formed under the transparent electrode layer. The silicon photovoltaic layer comprises a first type silicon layer and a second type silicon layer. The first type silicon layer has first type dopants. The second type silicon layer has second type dopants of which polarity is opposite to a polarity of the first type dopants. The first type silicon layer is disposed under the I-VII compound photovoltaic layer. The second type silicon layer is disposed under the first type silicon layer. The electrode is formed under the second type silicon layer.

For example, the I-VII compounds may include CuCl, CuBr, CuI, AgBr, AgI, CuF, AgF, AgCl, AuF, AuCl, AuBr, AuI, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuF—ClBr, CuFClI, CuFBrI, CuIBrCl, AgFClBr, AgFClI, AgFBrI, AgClBrI, AuFClBr, AuFClI or AuClBrI.

Meanwhile, the I-VII compound may comprise any one of oxygen (O), sulfur (S) and selenium (Se).

For example, the transparent electrode layer may comprise indium tin oxide (ITO) or indium zinc oxide (IZO).

Further, the solar cell of claim may further comprise an undoped silicon layer between the first type silicon layer and the second type silicon layer.

Advantageous Effects

As described above, the solar cell according to the present invention can improve light utilization efficiency by arranging photovoltaic layers having different absorption wavelength regions up and down.

In addition, the I-VII compound and the silicon has a similar lattice constant, so that a high quality thin film can be formed to further improve light utilization efficiency.

DESCRIPTION OF THE DRAWINGS

FIG. 1 is a schematic cross-sectional view of a solar cell according to an exemplary embodiment of the present invention.

FIG. 2 is a schematic cross-sectional view of a solar cell according to another exemplary embodiment of the present invention.

FIG. 3 is a schematic cross-sectional view of a solar cell according to still another exemplary embodiment of the present invention.

FIG. 4 is a diagram for obtaining main parameters for contact between the I-VII compound photovoltaic layer and the silicon photovoltaic layer.

MODE FOR INVENTION

As the inventive concept allows for various changes and numerous embodiments, particular embodiments will be illustrated in the drawings and described in detail in the text. However, this is not intended to limit the present invention to the specific disclosed form, it should be understood to include all modifications, equivalents, and substitutes included in the spirit and scope of the present invention. In describing the drawings, similar reference numerals are used for similar components. In the accompanying drawings, the dimensions of the structures may be exaggerated than actual for clarity of the invention.

Terms such as first and second may be used to describe various components, but the components should not be limited by the terms. The terms are used only for the purpose of distinguishing one component from another. For example, without departing from the scope of the present invention, the first component may be referred to as the second component, and similarly, the second component may also be referred to as the first component.

The terminology used herein is for the purpose of describing particular embodiments only and is not intended to be limiting of the invention. Singular expressions include plural expressions unless the context clearly indicates otherwise. In this application, the terms "comprise" or "having" are intended to indicate that there is a feature, number, step, action, component, part, or combination thereof described in the specification, and should be understood that it does not exclude the possibility of the presence or addition of features, numbers, steps, actions, components, parts or combination thereof. In addition, A and B are 'connected' and 'coupled' means that in addition to A and B being directly connected or combined, another component C may be included between A and B so that A and B are connected or combined.

Unless defined otherwise, all terms used herein, including technical or scientific terms, have the same meaning as commonly understood by one of ordinary skill in the art. Terms such as those defined in the commonly used dictionaries should be construed as having meanings consistent with the meanings in the context of the related art, and are not construed in ideal or excessively formal meanings unless expressly defined in this application. In addition, in the claims for the method invention, the steps may be reversed in order unless the steps are explicitly bound in order.

Hereinafter, exemplary embodiments of the present invention will be described in detail with reference to the accompanying drawings.

FIG. 1 is a schematic cross-sectional view of a solar cell according to an exemplary embodiment of the present invention, and FIG. 2 is a schematic cross-sectional view of a solar cell according to another exemplary embodiment of the present invention.

The solar cell 100 according to an exemplary embodiment of the present invention includes a I-VII compound photovoltaic layer 110, a silicon photovoltaic layer 120, a first electrode 140, and a second electrode 130. As described below, a first type and a second type are p-type and n-type, or n-type or p-type, respectively. In other words, if the first type is p-type, the second type is n-type; on the contrary, if the first type is n-type, the second type is p-type.

The I-VII compound photovoltaic layer 110 includes a first type I-VII compound layer 111 and a second type I-VII compound layer 112. The first type I-VII compound layer 111 may include first type impurities. The second type I-VII compound layer 112 is formed under the first type I-VII compound layer 111, and includes second type II impurities for forming a polarity opposite to the first type impurities.

For example, the I-VII compound includes CuCl, CuBr, CuI, AgBr, AgI, CuF, AgF, AgCl, AuF, AuCl, AuBr, AuI, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuF—ClBr, CuFClI, CuFBrI, CuIBrCl, AgFClBr, AgFClI, AgFBrI, AgClBrI, AuFClBr, AuFClI or AuClBrI.

In this case, the p-type impurities may be oxygen (O), sulfur (S), selenium (Se), or the like, and the n-type impurities may be zinc (Zn), magnesium (Mg), or the like.

The silicon photovoltaic layer 120 includes a first type silicon layer 121 and a second type silicon layer 122. The first type silicon layer 121 and the second type silicon layer 122 may be formed of amorphous silicon or crystalline silicon.

The first type silicon layer 121 is formed under the second type I-VII compound layer 112 and includes a first type dopant. The second type silicon layer 122 is formed under the first type silicon layer 121 and includes a second type dopant for forming a polarity opposite to the first type dopant.

In this case, the p-type dopant may be boron (B), aluminum (Al), gallium (Ga), and the like, and the n-type dopant may be phosphorus (P), arsenic (As), or the like.

As shown in Table 1 below, the I-VII compound semiconductor has a lattice constant similar to that of silicon, so that a thin film of good quality can be formed. That is, the I-VII compound photovoltaic layer 110 has a lattice constant similar to that of the silicon photovoltaic layer 120, so that the I-VII compound photovoltaic layer 110 of good quality can be formed on the silicon photovoltaic layer 120.

TABLE 1

|  | Lattice constant (Å) | Bandgap energy (eV) |
| --- | --- | --- |
| Si | 5.43 | 1.1 (indirect) |
| CuCl | 5.42 | 3.399 |
| CuBr | 5.68 | 2.91 |
| CuI | 6.05 | 2.95 |

Additionally, it is also known that silicon has a diamond structure, while caper chloride (CuCl) also has a diamond structure. In particular, the (111) face of the silicon substrate is suitable for the crystal structure of the I-VII compound semiconductor, which may be stacked on the substrate.

I-VII compound semiconductors can have relatively large exciton binding energy, eg, at least twice as much exciton binding energy as those of group III nitrides, thereby improving quantum efficiency.

In addition, CuCl has bandgap energy in the ultraviolet region, and CuBr and CuI have bandgap energy in the visible region, but the absorption wavelength range is different from that of silicon. Thus, when the I-VII compound photovoltaic layer 110 and the silicon photovoltaic layer are stacked, the light utilization efficiency may be improved.

However, since the absorption wavelength region of the I-VII compound photovoltaic layer 110 is shorter than that of the silicon photovoltaic layer 120, it is preferable that the I-VII compound photovoltaic layer 110 becomes an incident surface of light. In this case, the long-wavelength light is not absorbed by the I-VII compound photovoltaic layer 110 and reaches the silicon photovoltaic layer 120. Conversely, when the silicon photovoltaic layer 120 is located above, not only the short wavelength light but also the long wavelength light is absorbed by the silicon photovoltaic layer 120, so that the I-VII compound photovoltaic layer 110 absorbs no light.

The first electrode 140 is formed under the second type silicon layer 122. Since the first electrode 140 is positioned on the opposite side of the incident surface of the light, the first electrode 140 may be formed to cover the entire bottom of the second type silicon layer 122. In addition, in order to reflect light, the first electrode 140 may include metal of high reflectivity, thereby improving light utilization efficiency.

The second electrode 130 is formed on a portion of the first type I-VII compound layer 111 to expose remaining portion of the first type I-VII compound layer 111, so that light can be incident through the remaining portion of the first type I-VII compound layer 111.

Meanwhile, as shown in the solar cell 200 illustrated in FIG. 2, the I-VII compound photovoltaic layer 110 may further include an undoped I-VII compound layer 113 formed between the first type I-VII compound layers 111 and the second type I-VII compound layers 112.

In addition, the silicon photovoltaic layer 120 may further include an undoped silicon layer 123 between the first type silicon layer 121 and the second type silicon layer 122.

In FIG. 2, although both of the undoped I-VII compound layer 113 and the undoped silicon layer 123 are formed, only one of the undoped I-VII compound layer 113 and the undoped silicon layer 123 may formed.

In addition, although not shown, a pattern may be formed on the exposed surface of the first type I-VII compound layer 111 to prevent total reflection of sunlight and increase the amount of incident light, or an antireflection film may be formed on the surface of the first type I-VII compound layer 111.

FIG. 3 is a schematic cross-sectional view of a solar cell according to still another exemplary embodiment of the present invention.

The solar cell 300 according to still another exemplary embodiment of the present invention includes a I-VII compound photovoltaic layer 310, a silicon photovoltaic layer 120, and an electrode 140.

The I-VII compound photovoltaic layer 310 includes a transparent electrode layer 312 and a I-VII compound layer 311 formed under the transparent electrode layer 312.

The transparent electrode layer 312 may include indium tin oxide (ITO) or indium zinc oxide (IZO), which is an optically transparent and conductive material.

At this time, the I-VII compound constituting the I-VII compound layer 311 may include CuCl, CuBr, CuI, AgBr, AgI 및 CuF, AgF, AgCl, AuF, AuCl, AuBr, AuI, CuFCl, CuBrF, CuFI, CuClBr, CuClI, CuBrI, AgFCl, AgFBr, AgFI, AgClBr, AgClI, AgBrI, AuFCl, AuFBr, AuFI, AuClBr, AuClI, AuBrI, CuF—ClBr, CuFClI, CuFBrI, CuIBrCl, AgFClBr, AgFClI, AgFBrI, AgClBrI, AuFClBr, AuFClI, or AuClBrI.

A pn junction is formed between the I-VII compounds in contact with indium tin oxide (ITO) or indium zinc oxide (IZO). In this case, the indium tin oxide (ITO) or indium zinc oxide (IZO) is operated as the n-type, the I-VII compound is operated as the p-type. Therefore, when the transparent electrode layer 312 is made of indium tin oxide (ITO) or indium zinc oxide (IZO) as in the present embodiment, the incident area of light can be increased.

In addition, the I-VII compound layer 311 may further include p-type impurities. Therefore, the I-VII compound constituting the I-VII compound layer 311 may include any one of oxygen (O), sulfur (S), and selenium (Se).

Meanwhile, the silicon photovoltaic layer 120 includes a first type silicon layer 121 and a second type silicon layer 122.

The first type silicon layer 121 is formed under the I-VII compound layer 311 and includes a first type dopant. The second type silicon layer 122 is formed under the first type silicon layer 121 and includes a second type dopant for forming a polarity opposite to the first type dopant.

In addition, the silicon photovoltaic layer 120 may further include an undoped silicon layer (not shown) between the first type silicon layer 121 and the second type silicon layer 122.

The electrode 140 is formed under the second type silicon layer 122. Since the electrode 140 is positioned on the opposite side of the incident surface of the light, the electrode 140 may be formed to cover the entire bottom of the second type silicon layer 122. In addition, in order to reflect light, the first electrode 140 may include metal of high reflectivity, thereby improving light utilization efficiency.

FIG. 4 is a diagram for obtaining main parameters for contact between the I-VII compound photovoltaic layer and the silicon photovoltaic layer.

The mathematical expression for the photon flux Φ shown in FIG. 4 may be expressed as Equation 1 below.

$$d\Phi(\lambda) = \Phi(\lambda)e^{-\alpha x}(1-e^{-\alpha dx}) \approx \alpha\Phi(\lambda)e^{-\alpha x}dx|$$  [Equation 1]

In addition, the probability G (x) in which one photon generates an electron-hole pair may be expressed by Equation 2 below.

$$G(x) = \eta_i(1 - R(\lambda))\alpha\Phi(\lambda)e^{-\alpha x},$$
$$= \alpha F(1 - R)$$ [Equation 2]

where R is the reflection coefficient.

From the above Equation 2, the minority carrier density $\delta p_n(x)$ of the quasi neutral region is represented by Equation 3 below.

$$-D_p \frac{d^2}{dx^2}\delta p_n(x) + \frac{\delta p_n(x)}{\tau_p} = \alpha F(1 - R)e^{-\alpha x},$$ [Equation 3]

where, $D_p$ is the diffusion constant of the hole, and $\tau_p$ is the excess-minority-carrier lifetime.

The homogeneous solution of Equation 3 above can be obtained as Equation 4 below.

$$\delta p_n(x)|_h = A\cosh\frac{x}{L_p} + B\sinh\frac{x}{L_p} = Ay_1(x) + By_2(x)$$ [Equation 4]

$$S(x) = \alpha F(1 - R)e^{-\alpha x}/D_p$$

$$W(x) = \begin{vmatrix} y_1 & y_2 \\ y_1' & y_2' \end{vmatrix} = 1/L_p$$

$$u_1(x) = -\int^x dx' \frac{S(x')y_2(x')}{W(x')} =$$

$$-\frac{\tau_p \alpha F(1-R)}{2}\left(\frac{e^{-(\alpha+1/L_p)x}}{\alpha L_p + 1} - \frac{e^{-(\alpha-1/L_p)x}}{\alpha L_p - 1}\right)$$

$$u_2(x) = \int^x dx' \frac{S(x')y_1(x')}{W(x')} =$$

$$\tau_p \frac{\alpha F(1-R)}{2}\left(\frac{e^{-(\alpha+1/L_p)x}}{\alpha L_p + 1} + \frac{e^{-(\alpha-1/L_p)x}}{\alpha L_p - 1}\right)$$

$$\delta p_n(x)|_p = u_1(x)y_1(x) + u_2(x)y_2(x) = -\frac{\alpha F(1-R)\tau_p}{\alpha^2 L_p^2 - 1}e^{-\alpha x}$$

where, $L_p$ is the diffusion length ($L_p^2 = D_p\tau_p$).

Meanwhile, when Equation 3 is applied to a hole, it may be expressed as Equation 5 below.

$$-D_p \frac{d^2}{dx^2}\delta p_n(x) + \frac{\delta p_n(x)}{\tau_p} = \alpha F(1-R)e^{-\alpha x}$$ [Equation 5]

Therefore, when Equation 5 is applied to Equation 4, the following Equation 6 is obtained.

$$\delta p_n(x) = A\cosh\frac{x}{L_p} + B\sinh\frac{x}{L_p} - \frac{\alpha F(1-R)\tau_p}{\alpha^2 L_p^2 - 1}e^{-\alpha x}$$ [Equation 6]

For Equation 6, as shown in FIG. 4, when the boundary condition is applied, it is expressed as Equation 7 below.

at $x = 0$: $S_p\delta p_n(0) = D_p\frac{d}{dx}\delta p_n(0)$ [Equation 7]

at $x = x_j$: $\delta p_n(x_j) = (0)$

Therefore, the current $J_p$ due to the hole is expressed by Equation 8 below.

$$\rightarrow J_p = -qD_p\frac{d}{dx}\delta p_n(x_j) = \left(\frac{qF(1-R)\alpha L_p}{\alpha^2 L_p^2 - 1}\right) \times$$ [Equation 8]

$$\left\{-\alpha L_p e^{-\alpha x_j} + \frac{\left(S_p L_p/D_p + \alpha L_p - e^{-\alpha x_j}\left(\frac{S_p L_p}{D_p}\cosh\frac{x_j}{L_p} + \sinh\frac{x_j}{L_p}\right)\right)}{\frac{S_p L_p}{D_p}\sinh\frac{x_j}{L_p} + \cosh\frac{x_j}{L_p}}\right\}$$

Similarly, if Equation 3 is applied to electron, it can be expressed as Equation 9 below.

$$D_n\frac{d^2}{dx^2}\delta n_p(x) + \frac{\delta n_p(x)}{\tau_n} = -\alpha F(1-R)e^{-\alpha x}$$ [Equation 9]

In transplantation, $D_n$ is the diffusion constant of the electron, $\tau_n$ is the excess-minority-carrier lifetime.

Therefore, when Equation 9 is applied to Equation 4, the following Equation 10 is obtained.

$$\delta n_p(x) =$$ [Equation 10]

$$A'\cosh\left(\frac{x-H}{L_n}\right) + B'\sinh\left(\frac{x-H}{L_n}\right) - \frac{\alpha F(1-R)\tau_n}{\alpha^2 L_n^2 - 1}e^{-\alpha x}$$

where, $L_n$ is the diffusion length ($L_n^2 = D_n\tau_n$).

For Equation 10, as shown in FIG. 4, when the boundary condition is applied, it is expressed as Equation 11 below.

at $x = H$: $S_n\delta n_p(H) = -D_n\frac{d}{dx}\delta n_p(H)$ [Equation 11]

at $x = x_j + W$: $\delta n_p(x_j + W) = (0)$

Therefore, the current $J_n$ by the electrons is expressed by Equation 12 below.

$$\rightarrow J_p = -qD_n\frac{d}{dx}\delta n_p(x_j + W) = \left(\frac{qF(1-R)\alpha L_n}{\alpha^2 L_n^2 - 1}\right)$$ [Equation 12]

$$e^{-\alpha(x_j+W)} \times \left\{-\alpha L_n + \frac{\left(\left(S_n\frac{L_n}{D_n} - \alpha L_n\right)e^{-\alpha H'} - \left(\left(\frac{S_n L_n}{D_n}\cosh\frac{H'}{L_n} + \sinh\frac{H'}{L_n}\right)\right)\right)}{\frac{S_n L_n}{D_n}\sinh\frac{H'}{L_n} + \cosh\frac{H'}{L_n}}\right\}$$

On the other hand, the drift current $J_{dr}$ is expressed by the following Equation 13.

$$J_{dr}(\lambda) = q \int_{x_j}^{x_j+W} G(x)dx \quad \text{[Equation 13]}$$
$$= qF(1-R)e^{-\alpha x_j}(1-e^{-\alpha W})$$

Therefore, the current in the depletion region is expressed by Equation 14 below.

$$J(\lambda) = J_p(\lambda) + J_{dr}(\lambda) + J_p(\lambda) \quad \text{[Equation 14]}$$

Equation 14 is an expression according to a predetermined wavelength. When Equation 14 is expand to all wavelength, it can be expressed as in Equation 15 below.

$$J_s = \int d\lambda J(\lambda) \quad \text{[Equation 15]}$$

In addition, the reverse saturation current is calculated by Equation 16 below.

$$J_0 = q\left(\frac{D_p n_i^2}{L_p N_D}\right)\frac{S_p L_p/D_p \cosh\frac{x_j}{L_p} + \sinh\frac{x_j}{L_p}}{S_p L_p/D_p \sinh\frac{x_j}{L_p} + \cosh\frac{x_j}{L_p}} + \quad \text{[Equation 16]}$$
$$q\left(\frac{D_n n_i^2}{L_n N_A}\right)\frac{S_n L_n/D_n \cosh\frac{H'}{L_n} + \sinh\frac{H'}{L_n}}{S_n L_n/D_n \sinh\frac{H'}{L_n} + \cosh\frac{H'}{L_n}}$$

From Equations 15 and 16, main parameters of the solar cell can be obtained as shown in Equation 17 below.

$$V_{oc} = \frac{\gamma k_B T}{q}\log\left(\frac{J_s}{J_o} + 1\right) \quad \text{[Equation 17]}$$
$$J = J_o(e^{qV/\gamma k_B T} - 1) - J_s,$$
$$V = \frac{\gamma k_B T}{q}\log\left(\frac{J+J_s}{J_o} + 1\right)$$
$$P = JV$$
$$\frac{\partial P}{\partial V} = 0 \rightarrow \text{Fill Factor}(FF) = \frac{V_m J_m}{V_{oc} J_s}$$

As described above, the solar cell according to the present invention can improve light utilization efficiency by arranging photovoltaic layers having different absorption wavelength regions up and down.

In addition, the I-VII compound and the silicon has a similar lattice constant, so that a high quality thin film can be formed to further improve light utilization efficiency.

Although the present invention has been described in the detailed description of the invention with reference to exemplary embodiments of the present invention, it will be understood to those skilled in the art that various modifications and variation can be made in the present invention without departing from the spirit or scope of the invention.

The invention claimed is:

1. A solar cell comprising:
a I-VII compound photovoltaic layer composed of:
a transparent electrode layer operating as n-type; and
a I-VII compound layer formed under the transparent electrode layer, the I-VII compound layer being a single layer not containing p-type dopants or containing p-type dopants to operate as p-type;
a silicon photovoltaic layer including a first type silicon layer and a second type silicon layer, the first type silicon layer having first type dopants, the second type silicon layer having second type dopants of which polarity is opposite to a polarity of the first type dopants, the first type silicon layer being disposed under the I-VII compound photovoltaic layer, and the second type silicon layer being disposed under the first type silicon layer; and
an electrode formed under the second type silicon layer,
wherein the I-VII compound includes AgBr, AgI, CuF, AgF, AgCl, AuF, AuCl, AuBr, AuI, CuFCl, CuBrF, CuFI, AgFCl, AgFBr, AgFI, AgClBr, AgClI, AgBrI, AuFCl, AuFBr, AuFI, AuClBr, AuClI, AuBrI, CuF—ClBr, CuFClI, CuFBrI, AgFClBr, AgFClI, AgFBrI, AgClBrI, AuFClBr, AuFClI, or AuClBrI.

2. The solar cell of claim 1, wherein the I-VII compound further includes a dopant that is any one of oxygen (O), sulfur (S), and selenium (Se).

3. The solar cell of claim 1, wherein the transparent electrode layer comprises indium tin oxide (ITO) or indium zinc oxide (IZO).

4. The solar cell of claim 1, further comprising:
an undoped silicon layer between the first type silicon layer and the second type silicon layer.

* * * * *